United States Patent
Jung et al.

(10) Patent No.: US 7,700,007 B2
(45) Date of Patent: Apr. 20, 2010

(54) ANISOTROPIC CONDUCTIVE FILM FORMING COMPOSITION

(75) Inventors: Ki Sung Jung, Ansan-Si (KR); Jeong Ku Kang, Seoul (KR); Jung Sik Choi, Anyang-Si (KR); Jong Hwa Lee, Siheung-Si (KR); Hyoun Young Kim, Siheung-Si (KR); Tu Won Chang, Seoul (KR)

(73) Assignee: Cheil Industries, Inc., Gumi-si, Gyungsangbuk-do (KR)

( * ) Notice: Subject to any disclaimer, the term of this patent is extended or adjusted under 35 U.S.C. 154(b) by 1046 days.

(21) Appl. No.: 11/273,160

(22) Filed: Nov. 14, 2005

(65) Prior Publication Data
US 2006/0148956 A1 Jul. 6, 2006

(30) Foreign Application Priority Data
Dec. 30, 2004 (KR) ............... 10-2004-0116624
Jun. 28, 2005 (KR) ............... 10-2005-0056199

(51) Int. Cl.
*H01B 1/00* (2006.01)
*H01B 1/22* (2006.01)
*C08K 3/08* (2006.01)

(52) U.S. Cl. ............ 252/500; 252/512; 524/439
(58) Field of Classification Search ........... 252/500, 252/512; 524/439
See application file for complete search history.

(56) References Cited

U.S. PATENT DOCUMENTS

| | | | | |
|---|---|---|---|---|
| 5,019,607 A | * | 5/1991 | Coltrain et al. | 523/435 |
| 5,932,339 A | * | 8/1999 | Sakurai et al. | 428/323 |
| 6,194,492 B1 | * | 2/2001 | Sakurai et al. | 523/515 |
| 6,319,311 B1 | * | 11/2001 | Katz et al. | 106/287.11 |
| 6,465,671 B1 | | 10/2002 | Bae et al. | |
| 6,660,943 B1 | * | 12/2003 | Gotoh et al. | 174/260 |
| 6,680,517 B2 | | 1/2004 | Namba | |
| 6,709,606 B2 | | 3/2004 | Matsumura et al. | |
| 6,806,581 B2 | | 10/2004 | Hsieh | |
| 6,812,065 B1 | * | 11/2004 | Kitamura | 438/119 |
| 6,833,180 B1 | * | 12/2004 | Kodemura | 428/220 |

FOREIGN PATENT DOCUMENTS

| JP | 2003-198119 A | 7/2003 |
|---|---|---|
| JP | 2004-067908 A | 3/2004 |

OTHER PUBLICATIONS

Ishibashi et al. "A New Anisotropic Conductive Film with Arrayed Conductive Particles," AMP Journal of Technology, vol. 5 (Jun. 1996).
Opdahl, Peter J., "Anisotropic Conductive Film for Flipchip Applications: An Introduction", Ito America Corporation//Sony Chemicals Corporation, Scottsdale, Arizona, http://www.flipchips.com/tutorial05.html (Sep. 20, 2005).
"High Density Anisotropic Conductive Film," http://www.btechcorp.com/acf.htm (Sep. 20, 2005).

* cited by examiner

*Primary Examiner*—Mark Kopec
*Assistant Examiner*—Jaison P Thomas
(74) *Attorney, Agent, or Firm*—Lee & Morse, P.C.

(57) ABSTRACT

Disclosed herein is an anisotropic conductive film forming composition, including at least one polymer comprising a polymer containing a silane group; at least one polymerizable compound; and a plurality of conductive particles. The at least one polymer may include an elastomeric polymer and a filler polymer, at least one of which contains a silane group. The at least one polymerizable compound may include a cross-linking agent and/or a polymerization reaction enhancer. The cross-linking agent may also have a silane group. In addition, the film forming composition may include a solvent. The film forming composition is advantageous in that the resulting anisotropic conductive film exhibits enhanced peel and adhesive strength and low electrical contact resistance.

33 Claims, No Drawings

ANISOTROPIC CONDUCTIVE FILM FORMING COMPOSITION

CROSS-REFERENCE TO RELATED APPLICATIONS

This application claims the benefit of Korean Patent Application Nos. 2004-116624, filed on Dec. 30, 2004 and 2005-56199 filed on Jun. 28, 2005 in the Korean Intellectual Property Office, the disclosure of which is incorporated herein by reference.

BACKGROUND OF THE INVENTION

1. Field of the Invention

The present invention relates, generally, to an anisotropic conductive film forming composition.

2. Description of the Related Technology

Recently, an anisotropic conductive film has been widely used to electrically connect electronic components. An anisotropic conductive film contains conductive particles dispersed in the film made from an elastic insulating material. An anisotropic conductive film is typically sandwiched by two electrodes. When a sufficient pressure is applied onto one electrode against the other, an electrical connection is established through the conductive particles in the film.

An anisotropic conductive film forming composition is typically composed of conductive particles and an insulating resin. As for the insulating resin, a thermosetting resin is typically used and includes, for example, epoxy resins and acryl resins. The epoxy thermosetting resins have good adhesion strength onto various surfaces and have high heat resistance and moisture resistance properties. However, epoxy resins require a high curing temperature and a long curing time. On the other hand, the acryl thermosetting resins have a low (curing) temperature and a short (curing) time. However, the acryl resins do not have good adhesive strength, heat resistance, or moisture resistance.

SUMMARY OF CERTAIN INVENTIVE ASPECTS

One aspect of the invention provides an anisotropic conductive film forming composition. The composition comprises at least one polymer comprising a silane-group-containing polymer comprising a silane group; at least one polymerizable compound; and a plurality of conductive particles. The at least one polymer may be substantially free of a hydroxyl group. The at least one polymer may comprise a thermosetting polymer. The at least one polymer may comprise an elastomeric polymer and a filler polymer. At least one of the elastomeric polymer and the filler polymer may comprise the silane-group-containing polymer.

The composition may comprise the elastomeric polymer in an amount from about 5 wt % to about 80 wt % and the film forming polymer in an amount from about 10 wt % to about 60 wt % with reference to the total weight of the composition. In the composition, the elastomeric polymer may comprise one or more selected from the group consisting of acrylonitrile-, butadiene-, styrene-, acryl-, urethane-, polyamide-, olefin-, and silicone-based elastomers. The at least one polymer may comprise a polymer that does not contain a silane group. The silane-group-containing polymer may be in an amount from about 5 wt % to about 80 wt % with reference to the total weight of the composition. The silane-group-containing polymer may be in an amount from about 10 wt % to about 60 wt % with reference to the total weight of the composition.

The silane-group-containing polymer, when tested using an infrared spectrometer, may show no significant peaks in the range of 3200-3600 cm$^{-1}$.

In the above composition, the at least one polymerizable compound may comprise a (meth)acrylate-based monomer or oligomer. The (meth)acrylate-based monomer or oligomer may comprise a silane group. The at least one polymerizable compound may comprise at least one of a cross-linking agent and a polymerization reaction enhancer. The cross-linking agent may comprise a silane-group-containing monomer or oligomer. The composition may comprise the cross-linking agent in an amount from about 10 wt % to about 80 wt % and the polymerization reaction enhancer in an amount from about 0.5 wt % to about 50 wt % with reference to the total weight of the composition.

In the composition, the plurality of conductive particles may comprise metal balls in an amount from about 0.01 wt % to 30 wt % with reference to the total weight of the composition. The composition may further comprise a thermosetting initiator. The thermosetting initiator may comprise a peroxide-based curing agent or an azo-based curing agent. The composition may be in a liquid phase.

In the composition, the silane group may be represented by the following Formula 1-1:

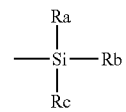

Formula 1-1

In the formula, each of Ra, Rb, and Rc may be selected from the group consisting of hydrogen, C1-C5 alkoxy, acryloxy, amine, and halogen.

The at least one polymer may comprise an elastomeric polymer that is represented by Formula 2:

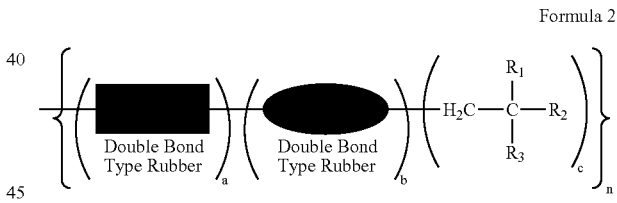

Formula 2

The double bond type rubber in the formula 2 may be selected from the group consisting of acrylonitrile-, butadiene-, styrene-, acryl-, isoprene-, urethane-, polyamide-, olefin-, and silicone-based rubbers. Each of a, b and c may be an integer from about 20 to about 100, and n may be an integer from 1 to about 5. Each of R1, R2 and R3 may be a substituent group represented by Formula 3-1, 3-2 or 3-3 below:

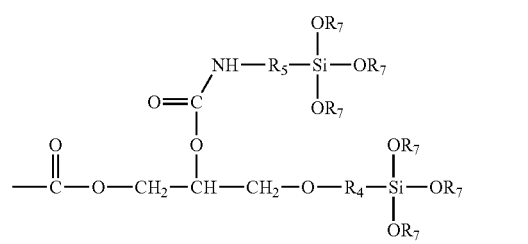

Formula 3-1

-continued

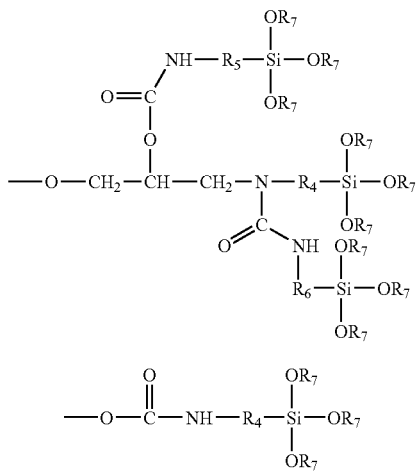

Formula 3-2

Formula 3-3

Each of R4, R5 and R6 may be phenyl, biphenyl, triphenyl, or naphthalene, or halogen-substituted or unsubstituted, linear or branched C1-C5 alkyl. $R_7$ may be methyl, ethyl, propyl or isopropyl.

In the composition, the silane-group-containing polymer may be represented by Formula 4:

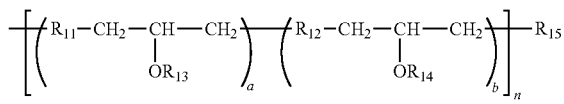

Formula 4

In the formula, each of R11 and R12 may be a substituent group which is a dehydrogenated form of a substituted or unsubstituted phenol at one or two hydroxyl groups thereof. Each of R11 and R12 may be connected to a neighboring carbon atom via the oxygen atom of the dehydrogenated hydroxyl group. Each of R13 and R14 may be a substituent group represented by Formula 5:

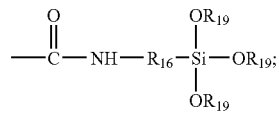

Formula 5

R15 may be a substituent group represented by Formula 6:

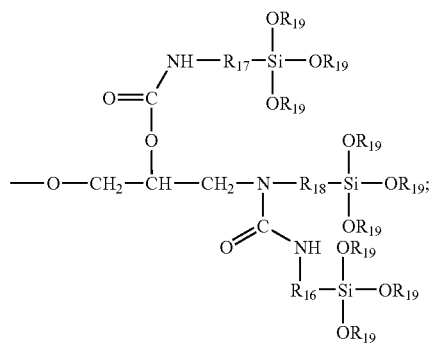

Formula 6

Each of a and b may be an integer ranging from 1 to about 100, and n may be 1, 2 or 3. Each of R16, R17 and R18 may be phenyl, biphenyl, triphenyl, naphthalene, or halogen-substituted or unsubstituted linear or branched C1-C5 alkyl; and R19 may be methyl, ethyl, propyl or isopropyl.

In the composition, the substituted or unsubstituted phenol may be selected from the group consisting of hydroquinone, 2-bromohydroquinone, resorcinol, catechol, bisphenol A, bisphenol F, bisphenol AD, bisphenol S, 4,4'-dihydroxybiphenyl, and bis(4-hydroxyphenyl)ether and the foregoing compounds substituted with one or more substituent groups. The substituted phenol may be substituted with one or more substituent groups selected from the group consisting of linear or branched C1-C5 alkyl, halogen-substituted linear or branched C1-C5 alkyl, nitro-substituted linear or branched C1-C5 alkyl, aryl, halogen-substituted aryl, nitro-substituted aryl, methylol, halogen-substituted methylol, nitro-substituted methylol, allyl, halogen-substituted allyl, nitro-substituted allyl, alicyclic, halogen-substituted alicyclic, nitro-substituted alicyclic, linear or branched C1-C5 alkoxycarbonyl, halogen-substituted linear or branched C1-C5 alkoxycarbonyl, and nitro-substituted linear or branched C1-C5 alkoxycarbonyl. The phenol may be selected from the group consisting of bisphenol A, bisphenol F, bisphenol AD, and bisphenol S substituent groups and one or more non-benzene-ring carbon atoms of the bisphenols may be substituted with a substituent group selected from the group consisting of linear or branched C1-C5 alkyl, allyl, alicyclic, or linear or branched C1-C5 alkoxycarbonyl.

In the composition, the at least one polymerizable compound may be represented by Formula 7:

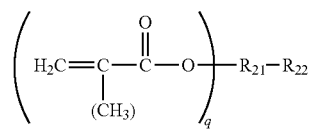

Formula 7

In the formula, q may be 1, 2 or 3. $R_{21}$ may be phenyl, biphenyl, triphenyl, naphthalene, or halogen-substituted or unsubstituted linear or branched C1-C5 alkyl. $R_{22}$ may be a substituent group represented by Formula 8-1, 8-2 or 8-3:

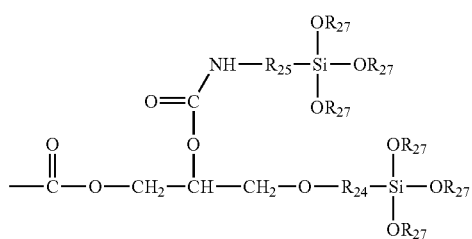

Formula 8-1

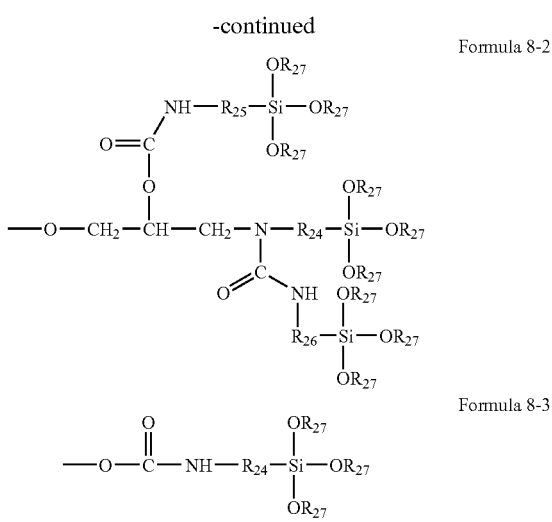

Formula 8-2

Formula 8-3

In the formulas above, each of $R_{24}$, $R_{25}$ and $R_{26}$ may be phenyl, biphenyl, triphenyl, naphthalene or halogen-substituted or unsubstituted linear or branched C1-C5 alkyl; and $R_{27}$ may be methyl, ethyl, propyl or isopropyl.

In the composition, the at least one polymer may comprise an elastomeric polymer having a weight average molecular weight from about 500 to about 5,000,000. The at least one polymer may comprise a silane-group-containing filler polymer having a weight average molecular weight from about 500 to about 300,000.

Another aspect of the invention provides a method of making an electronic device. The method comprises: providing an intermediate product of an electronic device comprising a first conductive portion; providing the anisotropic conductive film forming composition as described above; contacting the composition with the first conductive portion of the intermediate product; and polymerizing the polymerizable compound of the anisotropic conductive film forming composition so as to form an anisotropic conductive film in contact with the first conductive portion. The intermediate product may further comprise a second conductive portion and the method may further comprise contacting the composition with the second conductive portion of the intermediate product prior to polymerizing. The anisotropic conductive film may be substantially free of a hydroxyl group. The anisotropic conductive film may show no significant peaks in 3200-3600 cm-1 when tested using an infrared spectrometer.

Yet another aspect of the invention provides an electronic device made by the method described above.

Yet another aspect of the invention provides an electronic device comprising: an anisotropic conductive film; and at least one electrically conductive part in contact with the anisotropic conductive film, wherein the anisotropic conductive film comprises a silane-group containing polymer in an amount from about 5 wt % to about 80 wt % with reference to the total weight of the anisotropic conductive film. In the electronic device, the amount of the silane-group containing polymer may range from about 10 wt % to about 60 wt % with reference to the total weight of the anisotropic conductive film. In the electronic device, the anisotropic conductive film of the electronic device may provide no significant peaks in 3200-3600 cm$^{-1}$ when tested using an infrared spectrometer.

Yet another aspect of the invention provides an anisotropic conductive film forming composition, comprising an elastomer, a silane-group-containing film forming agent, a radical polymerizable thermosetting initiator, a first (meth)acrylate-based monomer or oligomer, a second (meth)acrylate-based monomer, conductive particles, and an organic solvent.

DETAILED DESCRIPTION OF EMBODIMENTS

Various aspects and features of the invention will become more fully apparent from the following description.

An anisotropic conductive film of an embodiment of the invention comprises an insulating polymer with conductive particles dispersed in the polymer. The anisotropic conductive film of the embodiment is used to electrically connect electronic components. In one embodiment, the anisotropic conductive film is placed between two electrodes. When a sufficient pressure is applied onto one electrode against the other, electrical connection is established through the conductive particles in the film. The film has a variety of applications for electrical connection in various kinds of electronic devices.

According to an embodiment of the invention, an anisotropic conductive film forming composition comprises at least one polymer comprising a silane group, at least one polymerizable compound, and a plurality of conductive particles. The at least one silane-group-containing polymer comprises one or more silane groups. The anisotropic film formed from the composition exhibits high peel strength and low electrical contact resistance. An anisotropic conductive film forming composition known to the inventors includes a non-polymer compound containing a silane group. The silane-group-containing compound is used as a cross-linking agent to increase the adhesive strength of the resulting film. However, the silane-group-containing non-polymer compound has a low molecular weight and is vaporized during drying and/or high temperature curing processes. This significantly decreases the adhesiveness of the resulting anisotropic conductive film onto the conductive surface on which the film is formed.

The silane group contained in the at least one polymer used for the film forming composition is represented by the following Formula 1-1:

Formula 1-1

In the formula, each of Ra, Rb, and Rc is selected from hydrogen, C1-C5 alkoxy, acryloxy, amine, or halogen. The silane group may be introduced to a polymer in a reaction between a moiety of the polymer and an organosilane compound with one or more reactive substituent groups. The reactive substituent groups may be an amine group, an epoxy group, or an isocyanate group. In the following descriptions, amine-, epoxy-, or isocyanate-based silanes refer to organosilane compounds containing at least one amine, epoxy or isocynate group, respectively.

In one embodiment, the film forming composition may include the at lease one silane-group-containing polymer in an amount from about 5 wt % to about 80 wt % with reference to the total weight of the composition. In another embodiment, the silane-group containing polymer is in an amount from about 10 wt % to about 60 wt %, optionally from about 15 wt % to about 45 wt % with reference to the total weight of the composition.

In one embodiment, the at least one silane-group-containing polymer may be an elastomeric polymer and/or a filler polymer. In one embodiment, the at least one polymerizable compound may be a cross-linking agent and/or a polymerization reaction enhancer. In one embodiment, the cross-linking agent may also have a silane group. In one embodiment, the film forming composition may include a solvent and is in a liquid phase. In some embodiments, the anisotropic conductive film composition may further include additives such as a polymerization inhibitor, an antioxidant, etc.

In one embodiment, the composition includes about 5 wt % to about 80 wt % of an elastomeric polymer, about 10 wt % to about 60 wt % of a silane-group-containing filler polymer, about 10 wt % to about 80 wt % of a cross-linking agent, about 0.5 wt % to about 50 wt % of a polymerization reaction enhancer, about 0.1 wt % to about 15 wt % of a thermosetting initiator, about 0.01 wt % to 30 wt % of conductive particles with the balance of an organic solvent. In the foregoing embodiment, the amounts in wt % are with reference to the total weight of the composition.

Elastomeric Polymer

In some embodiments, the anisotropic conductive film composition may include an elastomeric polymer. The elastomeric polymer provides elasticity to the resulting anisotropic conductive film. The elastomeric polymer may be a rubber with a carboxyl or epoxy group. Such elastomeric polymer is, for example, acrylonitrile-, butadiene-, acryl-, urethane-, polyamide-, olefin-, or silicone-based rubber. In one embodiment, the elastomeric polymer contains no silane group. In another embodiment, the elastomeric polymer contains a silane group. The silane group contained in the elastomeric polymer is represented by Formula 1-1 as described above. In certain embodiments, the silane group may be, for example, an epoxy- or amino-based silane.

In one embodiment, the silane-group-containing elastomeric polymer is represented by the following Formula 2:

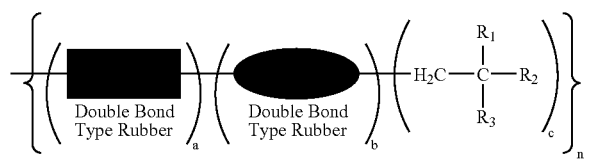

Formula 2

In Formula 2, the double bond type rubber is acrylonitrile-, butadiene-, styrene-, acryl-, urethane-, polyamide-, olefin-, silicone rubber or a combined rubber with one or more of the foregoing rubbers. Each of a, b and c is an integer from about 20 to about 100. n is an integer from 1 to 5. In addition, each of $R_1$, $R_2$ and $R_3$ is independently a substituent group represented by Formulas 3-1, 3-2, or 3-3 below:

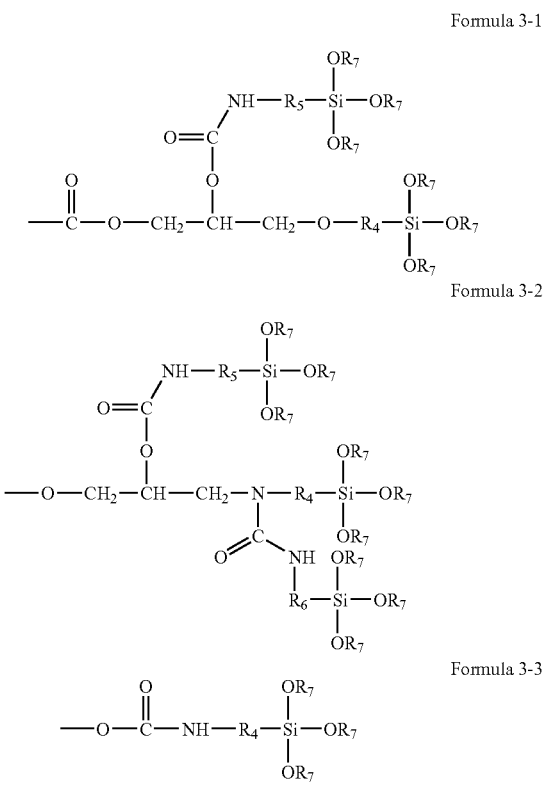

Formula 3-1

Formula 3-2

Formula 3-3

In the above Formulas 3-1 to 3-3, each of R4, $R_5$ and $R_6$ is independently a substituted or unsubstituted, linear or branched C1-C5 alkyl group or an aryl group. The substituted alkyl group may be halogen-substituted. The aryl group may be selected from phenyl, biphenyl, triphenyl and naphthyl. $R_7$ is a methyl group, an ethyl group, a propyl group or an isopropyl group.

The elastomeric polymer may have a weight average molecular weight ranging from about 500 to about 5,000,000. In other embodiments, the weight average molecular weight of the elastomeric polymer is between about 10,000 and about 3,000,000, optionally between about 20,000 and about 1,000,000. Further, the elastomeric polymer may be in an amount of about 5 wt % to 80 wt % with reference to the total weight of the composition. In other embodiments, the elastomeric polymer is in an amount from about 10 wt % to about 60 wt %, optionally from about 15 wt % to about 45 wt % with reference to the total weight of the film forming composition.

In one embodiment, the silane-group-containing elastomeric polymer may be prepared by a reaction between an organosilane and a rubber. The organosilane refers to a compound containing the silane group of Formula 1-1. The organosilane may be represented by Formula 1-2 below:

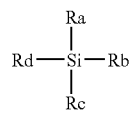

Formula 1-2

In the formula, each of Ra, Rb, and Rc may be a hydrogen atom, a C1-C5 alkoxy group, an acryloxy group, an amine group, or a halogen atom. Ra, Rb, or Rc may be hydrolyzed or chemically bonded to an inorganic material such as silica. Ra, Rb, or Rc may have charges showing an affinity to an inorganic material. Rd may be an organic substituent group containing a reactive substituent group that can form a chemical bonding with a polymer. The reactive substituent may be an epoxy group, an amine group, or an isocyanate group. Rd may be, for example, a linear or branched C1-C5 alkyl or an aryl substituted with one or more of the reactive substituent groups. The alkyl group may be further substituted with halogen. The aryl group may be phenyl, biphenyl, triphenyl or naphthyl.

In one embodiment, the organosilane may be an epoxy- or amine-based silane. An epoxy-based silane may be reacted with a carboxyl group of a resin to form a silane-group-containing elastomer. An amine-based silane may be reacted with an epoxy group present in a rubber. Examples of epoxy-based silanes include γ-glycidoxypropyltrimethoxy silane, γ-glycidoxytriethoxy silane, γ-glycidoxypropylmethyldiethoxy silane, γ-glycidoxypropylmethyldimethoxy silane, 2-(3,4-epoxycyclohexy)-ethyltrimethoxy silane, and 2-(3,4-epoxycyclohexy)-ethyltriethoxy silane.

Examples of amine-based silanes include N-acryloxy-2-hydroxypropyl-3-aminopropyltrimethoxy silane, N-(3-methacryloxy-2-hydroxypropyl)-3-aminopropyltriethoxy silane, γ-aminopropyltriethoxy silane, γ-aminopropyltrimethoxy silane, γ-aminopropylmethyldiethoxy silane, γ-aminopropylmethyldimethoxy silane, N-[3-(trimethoxysily)propyl]ethylenediamine, N-β-(aminoethyl)-γ-aminopropyltriethoxy silane, diethylenetriaminopropyltrimethoxy silane, diethylenetriaminopropyltriethoxy silane, diethylenetriaminopropylmethyldimethoxy silane, cyclohexylaminopropyltrimethoxy silane, hexanediaminomethyldiethoxy silane, anilinomethyltriethoxy silane, anilinomethyltrimethoxy silane, and methylaminopropyltrimethoxy silane.

Filler Polymer (Film Forming Agent)

In embodiments, the anisotropic conductive film forming composition includes at least one filler polymer. The filler polymer forms the body of the film and may or may not have elasticity. In one embodiment, the filler polymer may be a silane-group-containing polymer. In one embodiment, the silane-group-containing polymer is a phenoxy resin containing a silane group.

In one embodiment, the silane-group-containing filler polymer is represented by Formula 4 below:

Formula 4

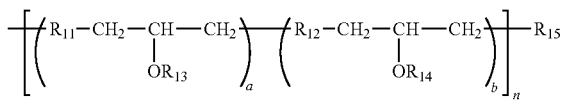

In the formula, each of a and b is an integer ranging from 1 to about 100, and n is an integer ranging from 1 to 3. Each of R11 and R12 is a substituent group derived from a phenol having one or more hydroxyl groups. Each of R11 and R12 is a dehydrogenated form of a substituted or unsubstituted phenol at one or two hydroxyl groups thereof. Each of R11 and R12 is connected to a neighboring carbon atom via the oxygen atom of dehydrogenated hydroxyl group. The phenol may be selected from hydroquinone, 2-bromohydroquinone, resorcinol, catechol, bisphenol A, bisphenol F, bisphenol AD, bisphenol S, 4,4'-dihydroxybiphenyl, or bis(4-hydroxyphenyl)ether. Each of R11 and R12 may be substituted with one or more substituent groups selected from linear or branched C1-C5 alkyl, aryl, methylol, allyl, alicyclic, linear or branched C1-C5 alkoxycarbonyl, or the foregoing substituent groups which are substituted with at least one of halogen atoms or a nitro substituent group. When the phenol is selected from bisphenol A, bisphenol F, bisphenol AD, or bisphenol S, one or more non-benzene-ring carbon atoms of the bisphenols may be substituted with a substituent group selected from linear or branched C1-C5 alkyl, allyl, alicyclic, or linear or branched C1-C5 alkoxycarbonyl.

For example, the substituted or unsubstituted phenol for $R_{11}$ and $R_{12}$ may include: 4,4'-(1-methylethylidene)bis[2-methylphenol], 4,4'-methylenebis [2-methylphenol], 4,4'-(1-methylethylidene)bis[2-(1-methylethyl)phenol], 4,4'-(1-methylethylidene)bis[2-(111-methylpropyl)phenol], 4,4'-(1-methylethylidene)bis[2-(1,1-dimethylethyl)phenol], tetramethylbisphenol A, tetramethylbisphenol F, 4,4'-methylenebis[2,6-bis(1,1-dimethylethyl)phenol], 4,4'-(1-methylethylidene)bis[2,6-di(1,1-dimethylethyl)phenol], 4,4'-(1-methylethylidene)bis [2-(2-propenyl)phenol], 4,4'-methylenebis [2-(2-propenyl)phenol], 4,4'-(1-methylethylidene)bis[2-(1-phenylethyl)phenol], 3,3'-dimethyl[1,1'-biphenyl]-4,4'-diol, 3,3',5,5'-tetramethyl-[1,1'-biphenyl]-4,4'-diol, 3,3',5,5'-tetra-t-butyl-[1,1'-biphenyl]-4,4'-diol, 3,3'-bis(2-propenyl)-[1,1'-biphenyl]-4,4'-diol, 4,4'-(1-methylethylidene)bis [2-methyl-6-hydroxymethylphenol], tetramethylolbisphenol A, 3,3',5,5'-tetrakis(hydroxymethyl)-(1,1'-biphenyl)-4,4'-diol, 4,4'-(1-methylethylidene)bis[2-phenylphenol], 4,4'-(1-methylethylidene)bis[2-cyclohexylphenol], 4,4'-methylenebis(2-cyclohexyl-5-methylphenol), 4,4'-(1-methylpropylidene)bisphenol, 4,4'-(1-methylheptylidene) bisphenol, 4,4'-(1-methyloctylidene) bisphenol, 4,4'-(1,3-dimethylbutylidene) bisphenol, 4,4'-(2-ethylhexylidene) bisphenol, 4,4'-(2-methylpropylidene) bisphenol, 4,4'-3-propylidene bisphenol, 4,4'-(1-ethylpropylidene) bisphenol, 4,4'-(3-methylbutylidene) bisphenol, 4,4'-(1-phenylethylidene) bisphenol, 4,4'-(phenylmethylene) bisphenol, 4,4'-(diphenylmethylene) bisphenol, 4,4'-[1-(4-nitrophenyl)ethylidene] bisphenol, 4,4'-[1-(4-aminophenyl)ethylidene] bisphenol, 4,4'-[(4-bromophenyl)methylene] bisphenol, 4,4'-[(4-chlorophenyl)methylene] bisphenol, 4,4'-[(4-fluorophenyl)methylene] bisphenol, 4,4'-(2-methylpropylidene)bis[3-methyl-6-(1,1-dimethylethyl)phenol], 4,4'-(1-ethylpropylidene)bis[2-methylphenol], 4,4'-(1-phenylethylidene)bis[2-methylphenol], 4,4'-(phenylmethylene)bis-2,3,5-trimethylphenol, 4,4'-(1-phenylethylidene)bis[2-(1,1-dimethylethyl)phenol], 4,4'-(1-methylpropylidene)bis[2-cyclohexyl-5-methylphenol], 4,4'-(1-phenylethylidene)bis[2-phenylphenol], 4,4'-butylidenebis [3-methyl-6-(1,1-dimethylethyl)phenol], 4-hydroxy-α-(4-hydroxyphenyl-α-methylbenzeneacetylenemethylester, 4-hydroxy-α-(4-hydroxyphenyl-α-methylbenzeneacetyleneethylester, 4-hydroxy-α-(4-hydroxyphenyl)benzeneacetylenebutylester, tetrabromo bisphenol A, tetrabromo bisphenol F, tetrabromo bisphenol AD, 4,4'-(1-methylethylene)bis [2,6-dichlorophenol], 4,4'-(1-methylethylidene)bis[2-chlorophenol], 4,4-(1-methylethylidene)bis[2-chloro-6-methylphenol], 4,4'-methylenebis [2-fluorophenol], 4,4'-methylenebis [2,6-difluorophenol], 4,4'-isopropylidenebis

[2-fluorophenol], 3,3'-difluoro-[1,1'-diphenyl]-4,4'-diol, 3,3', 5,5'-tetrafluoro-[1,1'-biphenyl]-4,4'-diol, 4,4'-(phenylmethylene)bis[2-fluorophenol], 4,4'-(4-fluorophenyl)methylenebis[2-fluorophenol], 4,4'-(fluoromethylene)bis[2,6-difluorophenol], 4,4'-(4-fluorophenyl)methylenebis [2,6-difluorophenol], 4,4'-(diphenylmethylene)bis[2-fluorophenol], 4,4'-(diphenylmethylene)bis[2,6-difluorophenol], 4,4'-(1-methylethylene)bis[2-nitrophenol], 1,4-naphthalenediol, 1,5-naphthalenediol, 1,6-naphthalenediol, 1,7-naphthalenediol, 2,7-naphthalenediol, 4,4'-dihydroxydiphenylether, bis(4-hydroxyphenyl)methanone, 4,4'-cyclohexylidenebisphenol, 4,4'-cyclohexylidenebis [2-methylphenol], 4,4'-cyclopentylidenebisphenol, 4,4'-cyclopentylidenebis [2-methylphenol], 4,4'-cyclohexylidene [2,6-dimethylphenol], 4,4'-cyclohexylidenebis [2-(1,1-dimethylethyl)phenol], 4,4'-cyclohexylidenebis [2-cyclohexylphenol], 4,4'-(1,2-ethanediyl) bisphenol, 4,4'-cyclohexylidenebis [2-phenylphenol], 4,4'-[1,4-phenylenebis (1-methylethylidene)] bis [2-methylphenol], 4,4'-[1,3-phenylenebis (1-methylethylidene)] bisphenol, 4,4'-[1,4-phenylenebis(1-methylethylidene)]bisphenol, 4,4'-[1,4-phenylenebis(1-methylethylidene)]bis[2-methyl-6-hydroxymethylphenol], 4-[1-[4-(4-hydroxy-3-methylphenyl)-4-methylcyclohexyl]-1-methylethyl]-2-methylphenol, 4-[1-(4-hydroxy-3,5-dimethylphenyl)-4-methylcyclohexyl]-1-methylethyl)-2,6-dimethylphenol, 4,4'-(1,2-ethanediyl)bis[2,6-di-(1,1-dimethylethyl)phenol], 4,4'-(dimethylsilylene) bisphenol, 1,3-bis(p-hydroxyphenyl)-1,1,3,3-tetramethyldisiloxane, or a silicon oligomer having p-hydroxyphenyl groups at both terminals thereof, etc.

Further, the substituted or unsubstituted phenol for $R_1$ and $R_{12}$ may be a phenolic substituent group obtained by introducing a linear or branched C1-C5 alkyl group, an aryl group, a methylol group, or an allyl group to one or more benzene rings of 2,2'-methylidenebisphenol, 2,2'-methylethylidenebisphenol, or 2,2'-ethylidenebisphenol. The phenolic substituent group includes, for example: 2,2'-methylidenebis[4-methylphenol], 2,2'-ethylidenebis[4-methylphenol], 2,2'-methylidenebis [4,6-dimethylphenol], 2,2'-(1-methylethylidene)bis [4,6-dimethylphenol], 2,2'-(1-methylethylidene)bis [4-sec-butylphenol], 2,2'-methylidenebis [6-(1,1-dimethylethyl)-4-methylphenol], 2,2'-ethylidenebis [4,6-di(1,1-dimethylethyl)phenol], 2,2'-methylidenebis [4-nonylphenol], 2,2'-methylidenebis[3-methyl-4,6-di-(1,1-dimethylethyl)phenol], 2,2'-(2-methylpropylidene)bis[2,4-dimethylphenol], 2,2'-ethylidenebis[4-(1, 1-dimethylethyl)phenol], 2,2'-methylidenebis (2,4-di-t-butyl-5-methylphenol), 2,2'-methylidenebis (4-phenylphenol), 2,2'-methylidenebis [4-methyl-6-hydroxymethylphenol], 2,2'-methylenebis [6-(2-prophenyl) phenol], etc.

Each of $R_{13}$ and $R_{14}$ is a substituent group represented by Formula 5 below:

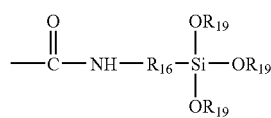

Formula 5

$R_{15}$ is a substituent group represented by Formula 6 below:

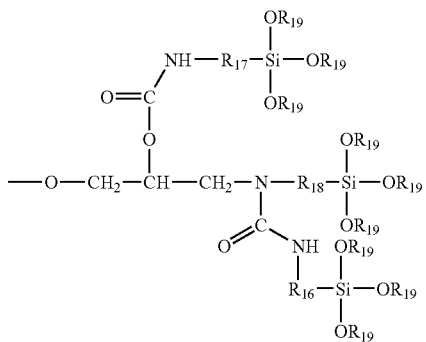

Formula 6

In Formulas 5 and 6, each of $R_{16}$, $R_{17}$ and $R_{18}$ is independently a halogen-substituted or unsubstituted C1-C5 alkyl group or an aryl group. The alkyl group may be branched or linear. The aryl group may be selected from phenyl, biphenyl, triphenyl and naphthyl. $R_{19}$ is a methyl group, an ethyl group, a propyl group, or an isopropyl group.

The silane-group-containing filler polymer has a weight average molecular weight ranging from about 500 to about 300,000. In other embodiments, the weight average molecular weight of the filler polymer is between about 10,000 and about 250,000, optionally between about 15,000 and about 200,000. In some embodiments, the filler polymer may be a mixture of two or more different polymers. The film forming composition may include the filler polymer in an amount of about 10 wt % to about 60 wt % with reference to the total weight of the composition. In other embodiments, the filler is in an amount from about 15 wt % to about 45 wt %, optionally from about 20 wt % to about 40 wt % with reference to the total weight of the film forming composition.

The silane-group-containing filler polymer can be prepared by a chemical reaction between an organosilane and a phenoxy resin containing a hydroxyl group or an epoxy group. For example, the filler polymer can be synthesized by a reaction between an isocyanate silane and a phenoxy resin containing a hydroxyl group. An isocyanate-based silane is highly reactive with a hydroxyl group. Alternatively, an amine-based silane can be reacted with a phenoxy resin containing an epoxy group.

Examples of isocyanate-based silanes include 3-isocyanatopropyltriethoxy silane and 3-isocyanatopropyltrimethoxy silane. Examples of amine-based silanes include N-acryloxy-2-hydroxypropyl-3-aminopropyltrimethoxy silane, N-(3-methacryloxy-2-hydroxypropyl)-3-aminopropyltriethoxy silane, γ-aminopropyltriethoxy silane, γ-aminopropyltrimethoxy silane, γ-aminopropylmethyldiethoxy silane, γ-aminopropylmethyldimethoxy silane, N-[3-(trimethoxysily)propyl]ethylenediamine, N-β-(aminoethyl)-γ-aminopropyltriethoxy silane, diethylenetriaminopropyltrimethoxy silane, diethylenetriaminopropyltriethoxy silane, diethylenetriaminopropylmethyldimethoxy silane, cyclohexylaminopropyltrimethoxy silane, hexanediaminomethyldiethoxy silane, anilinomethyltriethoxy silane, anilinomethyltrimethoxy silane, and methylaminopropyltrimethoxy silane.

Cross-linking (Coupling) Agent

According to embodiments of the invention, an anisotropic conductive film forming composition includes a cross-linking agent as a polymerizable compound. In some embodiments, a (meth)acrylate-based monomer or oligomer is used as the cross-linking agent. It may also contain a silane group.

In one embodiment, the cross-linking agent is represented by Formula 7 below:

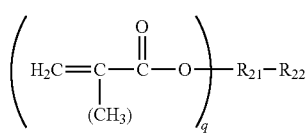

Formula 7

In Formula 7, $R_{21}$ is a substituted or unsubstituted, branched or linear C1-C5 alkyl or aryl group. The substituted alkyl group may be halogen-substituted. The aryl group may be selected from phenyl, biphenyl, triphenyl and naphthyl. "q" is an integer, 1, 2, or 3 and varies depending on the structure of $R_{21}$.

$R_{22}$ is a substituent group represented by Formula 8-1, 8-2, or 8-3 below.

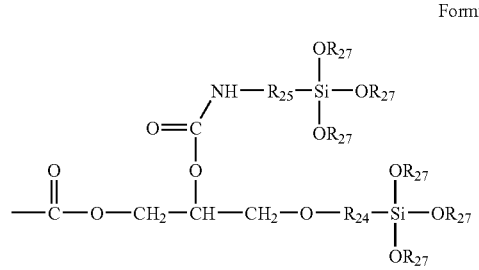

Formula 8-1

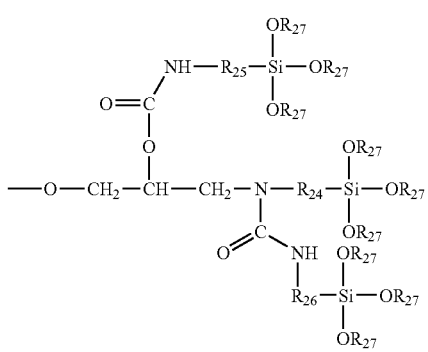

Formula 8-2

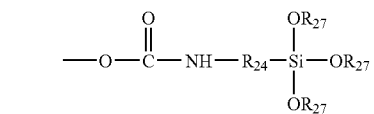

Formula 8-3

In Formulas 8-1 to 8-3, each of $R_{24}$, $R_{25}$ and $R_{26}$ is independently a substituted or unsubstituted, linear or branched C1-C5 alkyl group or an aryl group. The substituted alkyl group may be halogen-substituted. The aryl group may be selected from phenyl, biphenyl, triphenyl and naphthyl. $R_{27}$ is a methyl group, an ethyl group, a propyl group or an isopropyl group.

The (meth)acrylate-based monomers includes, for example, (meth)acrylates having a hydroxyl group, such as 2-hydroxyethyl(meth)acrylate, 2-hydroxypropyl (meth) acrylate, 2-hydroxybutyl (meth)acrylate, 2-hydroxy-3-acryoloxy propyl (meth)acrylate, 1-hydroxybutyl (meth)acrylate, polycaprolactone polyol mono(meth)acrylate, 2-hydroxy-3-phenyloxypropyl (meth)acrylate, 2-hydroxy 3-phenoxy propyl acrylate, 2-acryloyloxyethyl 2-hydroxy ethyl phthalate, di(meth)acrylate-based bisphenol A (e.g.: EB-600, available from SK-UCB, Korea), etc. The (meth) acrylate-based monomers includes, for example, (meth)acrylates containing an epoxy group, for example, glycidyl (meth) acrylate, methylglycidyl (meth)acrylate, (meth)acrylate containing alicyclic epoxy (e.g., M100 or A200 available from Daicel, Inc.). The (meth)acrylate-based monomers may also include (meth)acrylates containing a carboxyl group, for example, 2-methacryloyloxyethylhexahydrophthalate, 2-methacryloyloxyethylsuccinate, etc.

The (meth)acrylate-based oligomers are a compound that contains a plurality of repeating units based on one or more (meth)acrylate-based monomers and is eligible to polymerize upon initiation.

In one embodiment, the anisotropic conductive film forming composition may include the (meth)acrylate-based monomer or oligomer in an amount of about 10 wt % to about 80 wt % with reference to the total weight of the composition. In other embodiments, the (meth)acrylate-based monomer or oligomer is in an amount from about 20 wt % to about 60 wt %, optionally from about 30 wt % to about 50 wt % with reference to the total weight of the film forming composition.

The silane-group-containing cross-linking agent may be obtained by chemically reacting an organosilane with a (meth)acrylate-based monomer or oligomer containing at least one of a hydroxy, an epoxy, and a carboxyl group. The organosilane may be an amine-, epoxy- or isocyanate-based silane. An amine-based silane may be reacted with an epoxy group of the (meth)acrylate-based monomer or oligomer. An epoxy-based silane may be reacted with a carboxyl group of the (meth)acrylate-based monomer or oligomer. An isocyanate-based silane may be reacted with a hydroxyl group of the (meth)acrylate-based monomer or oligomer. The examples of amine-, epoxy-, and isocyanate-based silanes are identical to those listed above with reference to the elastomeric polymer and the filler polymer.

Polymerization Reaction Enhancer

In some embodiments, the film forming composition may include certain additives including a polymerization reaction enhancer which is a polymerizable compound. The polymerization reaction enhancer is added to facilitate polymerization reactions between one or more polymers and the cross-linking agent. In addition, the enhancer may have one or more other functions such as adjusting the viscosity of the composition and adjusting curing density.

The enhancer, in one embodiment, may be a (meth)acrylate-based monomer. Examples of the (meth)acrylate-based monomers for use as a polymerization reaction enhancer include neopentylglycolmono(meth)acrylate, 1,6-hexanediolmono(meth)acrylate, pentaerythritolpenta(meth) acrylate, dipentaerythritolpenta(meth)acrylate, glycerindi (meth)acrylate, tetrahydrofurfuryl(meth)acrylate, isodecyl (meth)acrylate, 2-(2-ethoxyethoxy)ethyl (meth)acrylate, stearyl (meth)acrylate, lauryl(meth)acrylate, 2-phenoxyethyl (meth)acrylate, isobornyl(meth)acrylate, tridecyl(meth)acrylate, ethoxylated nonylphenol(meth)acrylate, ethyleneglycoldi(meth)acrylate, diethyleneglycoldi(meth)acrylate, triethyleneglycoldi(meth)acrylate, tetraethyleneglycoldi (meth)acrylate, polyethyleneglycoldi(meth)acrylate, 1,6-hexanedioldi(meth)acrylate, 1,3-butyleneglycoldi(meth) acrylate, tripropyleneglycoldi(meth)acrylate, ethoxylated bisphenol-AD (meth)acrylate, cyclohexanedimethanoldi (meth)acrylate, phenoxytetraethyleneglycol(meth)acrylate, 2-hydroxyethylmethacryloyloxyethyl phosphate, 2-methacryloyloxyethyl phosphate, dimethylol tricyclo decene di(meth)acrylate, dipentaerythritol hexaacrylate, trimethylpropanebenzoate acrylate, or combinations thereof. The film forming composition may include the polymerization enhancer (meth)acrylate monomer in an amount of about 0.5 wt % to about 50 wt % with reference to the total weight of the composition. In other embodiments, the polymerization enhancer (meth)acrylate-based monomer is in an amount from about 1 wt % to about 30 wt %, optionally from about 3 wt % to about 20 wt % with reference to the total weight of the film forming composition.

Conductive Particles

The anisotropic conductive film includes a plurality of conductive particles. The conductive particles can be made of a number of different materials such as metals including Al, Au, Ag, Ni, Cu, alloys of various metals, solder, carbon, etc. In some embodiments, the conductive particles may be inorganic or organic particles coated with a conductive material. The conductive coating material may be conductive metals including gold and silver. In another embodiment, the metal-coated conductive particles are further coated with an insulating material. In one embodiment, the average particle size may be between about 2 to about 30 µm. The skilled artisans will be able to choose an appropriate size of the particles, depending on the dimensions of the circuit. In one embodiment, the film forming composition include the conductive particles in an amount of about 0.01 wt % to about 30 wt % with reference to the total weight of the film forming composition. In other embodiments, the conductive particles are in an amount from about 0.5 wt % to about 20 wt %, optionally from about 1 wt % to about 15 wt % with reference to the total weight of the film forming composition.

Thermosetting Initiator

The film forming composition may also include a thermosetting initiator as a polymerizable compound. The initiator is a polymerizable thermosetting polymerization initiator, for example, a peroxide or azo compound. Examples of peroxide-based initiators include t-butylperoxylaurate, 1,1,3,3-tetramethylbutylperoxy-2-ethylhexanoate, 2,5-dimethyl-2,5-di (2-ethylhexanoylperoxy)hexane, 1-cyclohexyl-1-methylethylperoxy-2-ethylhexanoate, 2,5-dimethyl-2,5-di (m-toluoylperoxy)hexane, t-butylperoxyisopropylmonocarbonate, t-butylperoxy-2-ethylhexylmonocarbonate, t-hexylperoxybenzoate, t-butylperoxyacetate, α,α'-bis(t-butylperoxy)diisopropylbenzene, dicumylperoxide, 2,5-dimethyl-2,5-di(t-butylperoxy)hexane, t-butylcumylperoxide, t-butylperoxyneodecanoate, t-hexylperoxy-2-ethylhexanoate, t-butylperoxy-2-2-ethylhexanoate, t-butylperoxyisobutyrate, 1,1-bis(t-butylperoxy) cyclohexane, t-hexylperoxyisopropylmonocarbonate, t-butylperoxy-3,5,5-trimethylhexanoate, t-butylperoxypivalate, cumylperoxyneodecanoate, diisopropylbenzenehydroperoxide, cumenehydroperoxide, isobutylperoxide, 2,4-dichlorobenzoylperoxide, 3,5,5-trimethylhexanoylperoxide, octanoylperoxide, lauroylperoxide, stearoylperoxide, succinic peroxide, benzoylperoxide, 3,5,5-trimethylhexanoylperoxide, octanoylperoxide, benzoylperoxytoluene, benzoylperoxide, 1,1,3,3-tetramethylbutylperoxyneodecanoate, 1-cyclohexyl-1-methylethylperoxyneodecanoate, di-n-propylperoxydicarbonate, diisopropylperoxycarbonate, bis(4-t-butylcyclohexyl)peroxydicarbonate, di-2-ethoxymethoxyperoxydicarbonate, di(2-ethylhexylperoxy)dicarbonate, dimethoxybutylperoxydicarbonate, di(3-methyl-3-methoxybutylperoxy)dicarbonate, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy)cyclododecane, 2,2-bis(t-butylperoxy)decane, t-butyltrimethylsilylperoxide, bis(t-butyl)dimethylsilylperoxide, t-butyltriallylsilylperoxide, bis(t-butyl)diallylsilylperoxide, tris(t-butyl)allylsilylperoxide, etc.

Examples of azo-based initiators for use as a thermosetting initiator include 2,2'-azobis(4-methoxy-2,4-dimethyl valeronitrile), dimethyl 2,2'-azobis (2-methylpropionate), 2,2'-azobis (N-cycloexyl-2-methylpropionamide), 2,2-azobis (2,4-dimethyl valeronitrile), 2,2'-azobis(2-methylbutyronitrile), 2,2'-azobis [N-(2-propenyl)-2-methylpropionamide], 2,2'-azobis(N-butyl-2-methylpropionamide), 2,2'-azobis [N-(2-propenyl)-2-methylpropionamide], 1,1'-azobis (cyclohexane-1-carbonitrile), 1-[(cyano-1-methylethyl)azo] formamide, etc.

In one embodiment, the thermosetting initiator is in an amount from about 0.1 wt % to about 15 wt % with reference to the total weight of the film forming composition. In other embodiments, the polymerizable thermosetting initiator is in an amount from about 0.3 wt % to about 10 wt %, optionally about 0.6 wt % to about 5 wt % with reference to the total weight of the film forming composition.

Solvent

In one embodiment, the composition is in a phase where the components are mixed with a solvent. The solvent may be an organic solvent. The organic solvent decreases the viscosity of the anisotropic conductive film forming composition, allowing easy film preparation. The organic solvent may be, but is not limited to, toluene, xylene, propyleneglycol monomethyl ether acetate, benzene, acetone, methylethylketone, tetrahydrofuran, dimethylformaldehyde, cyclohexanone, etc. In one embodiment, the organic solvent is included in an amount from about 5 wt % to about 70 wt % with reference to the total weight of the composition.

Other Additives

Additionally, the film forming composition may include other additives such as a polymerization inhibitor, an antioxidant, etc. In one embodiment, such additives may be in an amount of about 0.01 wt % to 10 wt % with reference to the total weight of the composition. In other embodiments, the additives are in an amount from about 0.05 wt % to about 5 wt %, optionally from about 0.1 wt % to about 3 wt % with reference to the total weight of the film forming composition.

The polymerization inhibitor prevents unwanted polymerization reactions in the film forming composition, for example, during storage or transportation of the film forming composition. The polymerization inhibitors for use in this film forming composition include, for example, hydroquinone, hydroquinonemonomethylether, para-benzoquinone, phenotiazine, and mixtures of two or more of the foregoing compounds. The antioxidant prevents oxidation of various components of the composition induced by heat. Examples of the antioxidants include a branched phenolic antioxidant and a hydroxy cinnamate antioxidant. Certain antioxidants provide the composition with heat stability as well as antioxidative activity. The antioxidant for use in the film forming composition includes, for example, tetrakis-(methylene-(3,5-di-terbutyl-4-hydrocinnamate)methane, 3,5-bis(1,1-dimethylethyl)-4-hydroxybenzenepropanoic acid thioldi-2,1-ethanediyl ester, octadecyl 3,5-di-t-butyl-4-hydroxyhydrocinnamate (available from Cibageigy), 2,6-di-t-butyl-p-methylphenol and mixtures of two or more of the foregoing compounds.

Anisotropic Conductive Film Formation

The anisotropic conductive film can be formed through polymerization and/or heat curing. In one embodiment, the anisotropic conductive film forming composition is first applied onto an electrode (a surface of a conductive material) of an electronic component or an intermediate product of an electronic device. Subsequently, an electrode (a surface of a conductive material) of another electronic component is placed over the composition while contacting only the film forming composition and not contacting the electrode of the other electronic component.

After applying the film forming composition between two electrodes, the composition is subject to heating to cure certain polymers and/or to polymerize polymerizable compounds. According to an embodiment, when the film forming composition is heated to an initiation temperature, the thermosetting polymerization initiator is activated and becomes a radical. The radical reacts with a polymerizable compound to form a bond between them. A compound resulting from this radical reaction is also a radical and reacts with another polymerizable compound such that polymerization reactions continue. The resulting radical compound may also react with a polymer formed through a series of radical reactions. Most of the resulting radical compounds, while participating in the polymerization process described above, also react with polymers existing in the film forming composition and form cross-links between them.

In one embodiment, the temperature for polymerization ranges between about 100° C. and about 300° C. In another embodiment, the temperate is between about 150° C. and about 200° C. The pressure and time depends on the desired properties of the resulting film. Skilled artisans will appreciate conditions of the polymerization/curing given the selected polymers and polymerizable compounds.

Unlike the anisotropic film forming composition that contains silane groups only in polymerizable small compounds, but not in polymers, the adhesive strength provided by silane groups can be maintained during the heating process because silane groups bonded to polymers may not be evaporated.

Electronic Devices

Another aspect of the invention provides an electronic device comprising an anisotropic conductive film. In one embodiment, the anisotropic conductive film is formed from the film forming composition described above. The anisotropic conductive film of the electronic device contains a silane-group-containing polymer in an amount ranging from about 5 wt % to about 80 wt % with reference to the total weight of the anisotropic conductive film. In other embodiments, the amount of the silane-group-containing polymer ranges from about 10 wt % to about 60 wt % with reference to the total weight of the anisotropic conductive film.

The electronic device may include, but is not limited to consumer electronic products, electronic circuit components, parts of the consumer electronic products, electronic test equipments, etc. The consumer electronic products may include, but are not limited to a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, etc.

A better understanding of the invention may be obtained in light of the following examples which are set forth to illustrate, but are not to be construed to limit the invention.

PREPARATIVE EXAMPLE 1

A 3-liter (L) cylindrical flask was provided with a stirring rod. The flask was loaded with 270 g of bisphenol A and F type phenoxy resin (E-1256, available from Japan Epoxy Resins Co., Ltd.) dissolved in propyleneglycol monomethyl acetate solution, containing 30 wt % of solid content, 0.1 g of n-butyltinlaurate serving as a catalyst for a reaction between a hydroxyl group and isocyanate, and 5 g of 3-isocyanatopropyltriethoxysilane as isocyanate silane. The mixture was then stirred at 75° C. for 8 hr. The termination point of the reaction was confirmed by observing no peak of a hydroxyl group in the range of 3200-3600 cm$^{-1}$ and no peak of an isocyanate in the range of 2000-2270 cm$^{-1}$, and by observing the peak of a primary amine in the range of 1580-1650 cm$^{-1}$ using an infrared spectrometer. The excess silane remaining after the completion of the reaction was later evaporated upon forming a film.

PREPARATIVE EXAMPLE 2

A 3-liter cylindrical flask with a stirring rod was loaded with 270 g of acrylonitrile butadiene-based natural rubber (N-34, available from Zeon Corp., Japan) dissolved in toluene solution, containing 30 wt % of solid content, 200 g of bisphenol A and F type phenoxy resin (E-4275, available from Japan Epoxy Resins Co., Ltd.) dissolved in propyleneglycol monomethyl acetate solution, 150 g of a difunctional isocyanourate-based acrylate containing a hydroxyl group (M–215, available from To a Gosei Co., Ltd., Japan), 260 g of bisphenol A type epoxy acrylate containing a hydroxyl group (EB-600, available from SK-UCB, Korea), 0.1 g of n-butyltinlaurate serving as a catalyst for a reaction between a hydroxyl group and isocyanate, 0.02 g of hydroquinone monomethylether serving as a radical inhibitor, and 100 g of propyleneglycol monomethyl ether acetate serving as a solvent. The resulting reaction mixture was added with 5 g of 3-glycidoxypropyltriethoxysilane as epoxy silane, and 15 g of 3-isocyanatopropyltriethoxysilane as isocyanate silane. Subsequently, the mixture was stirred at 75° C. for 8 hours. The termination point of the reaction was confirmed by observing no peaks of a hydroxyl group in the range of 3200-3600 cm$^{-1}$, a carboxyl group in the range of 2500-3000 cm$^{-1}$ and an isocyanate in the range of 2000-2270 cm$^{-1}$, and by observing the peak of a primary amine in the range of 1580-1650 cm$^{-1}$ using an infrared spectrometer. The excess silane remaining after the completion of the reaction was later evaporated upon forming a film.

PREPARATIVE EXAMPLE 3

A 3-liter cylindrical flask with a stirring rod was loaded with 230 g of acryl rubber (At-4000, available from Sam Won Co., Ltd., Korea) dissolved in toluene solution, containing 30 wt % of solid content, 70 g of epoxy-based acryl rubber (SG-80HDR, available from Nagase ChemteX Corp., Japan) dissolved in toluene solution, containing 25 wt % of solid content, 50 g of phenoxy resin as a bisphenol type polyester mixture serving as a film forming agent (PKHM-301, available from InChem Industry) dissolved in cyclohexanone solution, containing 20 wt % of solid content, 50 g of bisphenol A and F type epoxy having a high molecular weight (E-4275, available from Japan Epoxy Resins Co., Ltd.) dissolved in propyleneglycol monomethyl acetate solution, containing 30 wt % of solid content, 150 g of difunctional isocyanourate-based acrylate containing a hydroxyl group (M-215, available from To a Gosei Co., Ltd., Japan), 260 g of bisphenol A type epoxy acrylate containing a hydroxyl group (EB-600, available from SK-UCB, Korea), 0.1 g of n-butyltinlaurate serving as a catalyst for a reaction between a hydroxyl group and isocyanate, 0.02 g of hydroquinone monomethylether serving as a radical inhibitor, and 100 g of propyleneglycol monomethyl ether acetate serving as a solvent. The resulting reaction mixture was added with 5 g of 3-glycidoxypropyltriethoxysilane as epoxy silane, and 15 g of 3-isocyanatopropyltriethoxysilane as isocyanate silane, and then stirred at 75° C. for 8 hours. The termination point of the reaction was confirmed by observing no peaks of a hydroxyl group in the range of 3200-3600 $cm^{-1}$, a carboxyl group in the range of 2500-3000 $cm^{-1}$ and an isocyanate in the range of 2000-2270 $cm^{-1}$, and by observing the peak of a primary amine in the range of 1580-1650 $cm^{-1}$ using an infrared spectrometer. The excess silane remaining after the completion of the reaction was later evaporated upon forming a film.

PREPARATIVE EXAMPLE 4

A 3-liter cylindrical flask equipped with a stirring rod was loaded with 230 g of natural rubber (DN-003, available from Zeon Corp., Japan) dissolved in propyleneglycol monomethyl acetate solution, containing 30 wt % of solid content, branched cresol novolac type of resin serving as a film forming agent(YDCN-500-90 g, available from Kukdo Chemicals, Korea) dissolved in tetrahydrofuran solution, containing 25 wt % of solid content, 150 g of fluorene type of eapoxy resin serving as a film forming agent (BPEFG, available from Osaka Gas Co., Ltd. Japan) dissolved in propyleneglycol monomethyl ether acetate solution, containing 30 wt % of solid content, 150 g of difunctional isocyanourate-based acrylate containing a hydroxyl group (M-215, available from To a Gosei Co., Ltd., Japan), 260 g of bisphenol A type epoxy acrylate containing a hydroxyl group (EB-600, available from SK-UCB, Korea), 0.02 g of hydroquinone monomethylether serving as a radical inhibitor, and 100 g of propyleneglycol monomethyl ether acetate serving as a solvent. The resulting reaction mixture was added with 5 g of γ-aminopropyltrimethoxysilane as amino silane, and 15 g of 3-isocyanatopropyltriethoxysilane as isocyanate silane, and then stirred at 75° C. for 8 hours. The termination point of the reaction was confirmed by observing no peak of epoxy group in the range of 900-950 $cm^{-1}$ using an infrared spectrometer. The excess silane remaining after the completion of the reaction was later evaporated upon forming a film.

COMPARATIVE PREPARATIVE EXAMPLE 1

For comparison with the Preparative Example 2, the reaction procedure using a silane and the addition of n-butyltinlaurate serving as a catalyst for a reaction between a hydroxyl group and isocyanate were omitted. In addition, only a small amount of silane coupling agent was added. The composition was prepared as follows. A 3-liter cylindrical flask equipped with a stirring rod was loaded with 270 g of natural rubber (N-34, available from Zeon Corp., Japan) in toluene solution, containing 30 wt % of solid content, 200 g of phenoxy resin serving as a film forming agent (E-4275, available from Japan Epoxy Resins Co., Ltd.) dissolved in propyleneglycol monomethyl acetate solution, 150 g of difunctional isocyanourate-based acrylate containing a hydroxyl group (M-215, available from To a Gosei Co., Ltd., Japan), 260 g of bisphenol A type epoxy acrylate containing a hydroxyl group (EB-600, available from SK-UCB, Korea), 0.02 g of hydroquinone monomethylether serving as a polymerization inhibitor, and 100 g of propyleneglycol monomethyl ether acetate serving as a solvent. The mixture was then stirred at room temperature (25° C.) for 30 minutes.

COMPARATIVE PREPARATIVE EXAMPLE 2

For comparison with Preparative Example 3, the reaction procedure using a silane and the addition of n-butyltinlaurate serving as a catalyst for a reaction of a hydroxyl group and isocyanate were omitted. In addition, only a small amount of silane coupling agent was added. The composition was prepared as follows. A 3-liter cylindrical flask equipped with a stirring rod was loaded with 230 g of acryl rubber (At-4000, available from Sam Won Co., Ltd., Korea) dissolved in toluene solution, containing 30 wt % of solid content, 70 g of acryl rubber (SG-80HDR, available from Nagase ChemteX Corporation, Japan) dissolved in toluene solution, 50 g of phenoxy resin serving as a film forming agent (PKHM-301, available from InChem Industry in Chemicals) dissolved in cyclohexanone solution, containing 20 wt % of solid content, 50 g of epoxy (E-4275, available from Japan Epoxy Resins Co., Ltd.) dissolved in propyleneglycol monomethyl acetate solution, containing 30 wt % of solid content, 150 g of difunctional isocyanourate-based acrylate containing a hydroxyl group (M-215, available from To a Gosei Co., Ltd., Japan), 260 g of bisphenol A type epoxy acrylate containing a hydroxyl group (EB-600, available from UCB SunKyong, Korea), 0.02 g of hydroquinone monomethylether serving as a polymerization inhibitor, and 100 g of propyleneglycol monomethyl ether acetate serving as a solvent. The mixture was stirred at room temperature (25° C.) for 30 minutes.

COMPARATIVE PREPARATIVE EXAMPLE 3

For comparison with Preparative Example 4, in order to prevent the reaction of a silane coupling agent, the reaction procedure using a silane and a substituent group was omitted. In addition, only a small amount of silane coupling agent was added. A 3-liter cylindrical flask equipped with a stirring rod was loaded with 230 g of natural rubber (DN-003, available from Zeon Corp., Japan) in propyleneglycol monomethyl acetate solution, containing 30 wt % of solid content, branched cresol novolac type of resin serving as a film forming agent(YDCN-500-90P, available from Kukdo Chemicals, Korea) dissolved in tetrahydrofuran solution, containing 25 wt % of solid content, 150 g of epoxy-based fluorene resin serving as a film forming agent (BPEFG, available from Osaka Gas Co., Ltd. Japan) dissolved in propyleneglycol monomethyl ether acetate solution, containing 30 wt % of solid content, 150 g of difunctional isocyanourate-based acrylate containing a hydroxyl group (M-215, available from To a Gosei Co., Ltd., Japan), 260 g of bisphenol A type epoxy acrylate containing a hydroxyl group (EB-600, available from SK-UCB, Korea), 0.02 g of hydroquinone monomethylether serving as a polymerization inhibitor, and 100 g of propyleneglycol monomethyl ether acetate serving as a solvent. The mixture was then stirred at room temperature (25° C.) for 30 minutes.

EXAMPLE 1

A 300 g dispersible container was loaded with 30 g of the composition obtained in Preparative Example 1, 60 g of natural rubber (N-34, available from Zeon Corp., Japan) in toluene solution, containing 30 wt % of solid content, 20 g of bisphenol type epoxy acrylate (EB3701, available from SK-UCB, Korea), 10 g of trifunctional isocyanourate-based acrylate (NK-ESTER A-9300, available from Shin-Nakamura Chemical Co., Ltd., Japan), 2 g of 2-hydroxyethylmethacryloyloxyethyl phosphate, 2 g of 2-methacryloyloxyethyl phosphate, serving as a radical polymerizable acrylate-based second monomer, 0.5 g of fine powder type benzoylperoxide, 0.2 g of laurylperoxide, and 1.5 g of conductive particles comprising benzoguanine-based polymer particles coated with nickel and gold and having a particle size of 4 μm (available from NCI). The mixture was then stirred at room temperature (25° C.) for 20 minutes. The stirring process was conducted at a rate within a range so as not to break conductive particles.

EXAMPLE 2

A 300 g dispersible container was loaded with 90 g of the resin obtained in Preparative Example 2, 2 g of 2-hydroxyethylmethacryloyloxyethyl phosphate, 2 g of 2-methacryloyloxyethyl phosphate, serving as a radical polymerizable acrylate monomer, 0.5 g of fine powder type benzoylperoxide, 0.2 g of laurylperoxide, and 1.5 g of conductive particles comprising benzoguanine-based polymer particles coated with nickel and gold and having a particle size of 4 μm (available from NCI). The mixture was then stirred at room temperature (25° C.) for 20 minutes. The stirring process was conducted at a rate within a range so as not to break conductive particles.

EXAMPLE 3

A 300 g dispersible container was loaded with 90 g of the resin obtained in Preparative Example 3, 2 g of 2-hydroxyethylmethacryloyloxyethyl phosphate, 2 g of 2-methacryloyloxyethyl phosphate, serving as a radical polymerizable acrylate monomer, 0.5 g of fine powder type benzoylperoxide, 0.2 g of laurylperoxide, and 1.5 g of conductive particles comprising benzoguanine-based polymer particles coated with nickel and gold and having a particle size of 4 μm (available from NCI). The mixture was then stirred at room temperature (25° C.) for 20 minutes. The stirring process was conducted at a rate within a range so as not to break conductive particles.

EXAMPLE 4

A 300 g dispersible container was loaded with 90 g of the resin obtained in Preparative Example 4, 2 g of 2-hydroxyethylmethacryloyloxyethyl phosphate, 2 g of 2-methacryloyloxyethyl phosphate, serving as a radical polymerizable acrylate monomer, 0.5 g of fine powder type benzoylperoxide, 0.2 g of laurylperoxide, and 1.5 g of conductive particles comprising benzoguanine-based polymer particles coated with nickel and gold and having a particle size of 4 μm (available from NCI). The mixture was then stirred at room temperature (25° C.) for 20 minutes. The stirring process was conducted at a rate within a range so as not to break conductive particles.

COMPARATIVE EXAMPLE 1

A 300 g dispersible container was loaded with 90 g of the resin obtained in Comparative Preparative Example 1, 2 g of 2-hydroxyethylmethacryloyloxyethyl phosphate, 2 g of 2-methacryloyloxyethyl phosphate, serving as a radical polymerizable acrylate monomer, 0.5 g of fine powder type benzoylperoxide, 0.2 g of laurylperoxide, 0.5 g of 3-methacryloxypropyltrimethoxysilane as a radical polymerizable silane coupling agent, and 1.5 g of conductive particles comprising benzoguanine-based polymer particles coated with nickel and gold and having a particle size of 4 μm (available from NCI). The mixture was then stirred at room temperature (25° C.) for 20 minutes. The stirring process was conducted at a rate within a range so as not to break conductive particles.

COMPARATIVE EXAMPLE 2

A 300 g dispersible container was loaded with 90 g of the resin obtained in Comparative Preparative Example 2, 2 g of 2-hydroxyethylmethacryloyloxyethyl phosphate, 2 g of 2-methacryloyloxyethyl phosphate, serving as a radical polymerizable acrylate monomer, 0.5 g of fine powder type benzoylperoxide, 0.2 g of laurylperoxide, 0.5 g of 3-methacryloxypropyltrimethoxysilane as a radical polymerizable silane coupling agent, and 1.5 g of conductive particles comprising benzoguanine-based polymer particles coated with nickel and gold and having a particle size of 4 μm (available from NCI). The mixture was then stirred at room temperature (25° C.) for 20 minutes. The stirring process was conducted at a rate within a range so as not to break conductive particles.

COMPARATIVE EXAMPLE 3

A 300 g dispersible container was loaded with 90 g of the resin obtained in Comparative Preparative Example 3, 2 g of 2-hydroxyethylmethacryloyloxyethyl phosphate, 2 g of 2-methacryloyloxyethyl phosphate, serving as a radical polymerizable acrylate monomer, 0.5 g of fine powder type benzoylperoxide, 0.2 g of laurylperoxide, 0.5 g of 3-methacryloxypropyltrimethoxysilane as a radical polymerizable silane coupling agent, and 1.5 g of conductive particles comprising benzoguanine-based polymer particles coated with nickel and gold and having a particle size of 4 μm (available from NCI). The mixture was then stirred at room temperature (25° C.) for 20 minutes. The stirring process was conducted at a rate within a range so as not to break conductive particles.

Physical Properties of Anisotropic Conductive Films

To analyze the reliability of films formed from anisotropic conductive film forming compositions prepared in Examples 1 to 4 and Comparative Examples 1 to 3, each film was allowed to stand at room temperature (25° C.) for one hour. Each film was measured for reliability for 90° peel strength using 30 mm×30 mm ITO (Indium Tin Oxide) and COFs (Chip-On Films) having pitches of 55 μm, thicknesses of 12 μm and line widths of 40 μm. Also, reliability for electrical contact resistance was measured using ITO having the same size as the above ITO and TCPs (Tape Carrier Packages) having pitches of 65 μm, thicknesses of 18 μm and line widths of 30 μm for a copper circuit. For the above two tests, 10 samples each were prepared and measured under temporary bonding conditions of 160° C. for 1 second, and bonding conditions of 180° C. for 5 second, at a pressure of 3 MPa. In addition, the reliability test included a hygrothermal humidity test and a heat impact test. The humidity test was conducted at a temperate of 85° C. and a relative humidity of 85% for 1000 hours. The heat impact test was repeatedly conducted 1000 times at a temperature from −40 to 80° C. In addition, average peel strength after the reliability test was measured. The results are given in Table 1 below. Also, average electrical contact resistance after the reliability test was measured. The results are given in Table 2 below.

TABLE 1

| Properties (unit:gf/cm) | Initial Peel Strength | Peel Strength After Hygrothermal Humidity Test | Peel Strength After Heat Impact Test |
|---|---|---|---|
| Ex. 1 | 760 | 920 | 890 |
| Ex. 2 | 835 | 1120 | 1027 |
| Ex. 3 | 932 | 1320 | 1274 |
| Ex. 4 | 724 | 1087 | 980 |
| C. Ex. 1 | 833 | 534 | 432 |
| C. Ex. 2 | 975 | 432 | 352 |
| C. Ex. 3 | 750 | 360 | 242 |

As shown in Table 1, the film compositions of Examples 1 to 4 exhibited a higher peel strength after the reliability test. Although the invention is not bound to or by any theories, this result may be explained by the existence of significant amount of silane groups in the film that are bonded to the surface of the ITO glass and the surface of the inorganic material such as copper line.

TABLE 2

| Properties (unit: ohm) | Initial Electrical Contact Resistance | Electrical Contact Resistance After Hygrothermal Humidity Test | Electrical Contact Resistance After Heat Impact Test |
|---|---|---|---|
| Ex. 1 | 1.0 | 2.7 | 2.3 |
| Ex. 2 | 1.2 | 2.5 | 2.7 |
| Ex. 3 | 1.4 | 2.5 | 3.0 |
| Ex. 4 | 0.9 | 2.3 | 3.5 |
| C. Ex. 1 | 1.2 | 3.7 | 5.6 |
| C. Ex. 2 | 1.3 | 4.3 | 7.4 |
| C. Ex. 3 | 0.9 | 4.6 | 6.8 |

As shown in Table 2, the film compositions of Examples 1 to 4 exhibited a low electrical contact resistance after the reliability test. Again, although the invention is not bound to or by any theories, this may be because the conductive particles providing electrical conductivity are less deformed even after the reliability test, due to the coupling structure of silane in the anisotropic conductive film. As such, the anisotropic conductive films of the embodiments of the invention are reliable even under humid and/or high temperature conditions.

The foregoing description is that of embodiments of the invention and various changes, modifications, combinations and sub-combinations may be made without departing from the spirit and scope of the invention, as defined by the appended claims.

What is claimed is:

1. An anisotropic conductive film forming composition, comprising:
    at least one polymer including a silane-group-containing polymer, the silane- group-containing polymer including a silane group;
    at least one polymerizable compound; and
    a plurality of conductive particles,
    wherein the silane-group-containing polymer includes an elastomeric polymer that is represented by Formula 2:

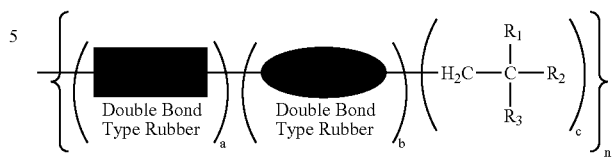

Formula 2 wherein the double bond type rubber in the formula 2 is selected from the group consisting of acrylonitrile-, butadiene-, styrene-, acryl-, isoprene-, urethane-, polyamide-, olefin-, and silicone-based rubbers;

wherein each of a, b and c is an integer from about 20 to about 100, and n is an integer from 1 to about 5;

wherein each of $R_1$, $R_2$, and $R_3$ is a substituent group represented by Formula 3-1, 3-2 or 3-3 below:

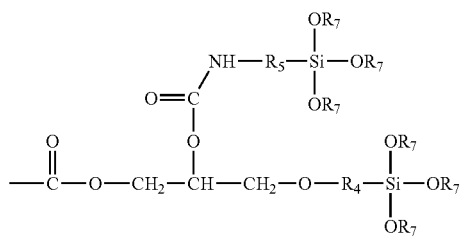

Formula 3-1

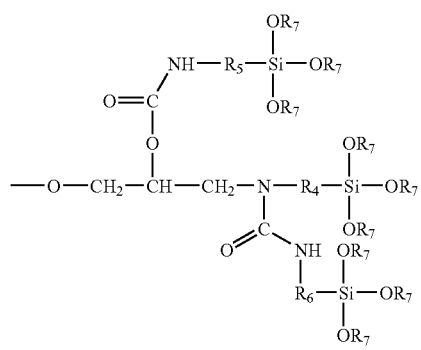

Formula 3-2

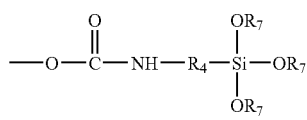

Formula 3-3 wherein each of $R_4$, $R_5$ and $R_6$ is phenyl, biphenyl, triphenyl, or naphthalene, or halogen-substituted or unsubstituted, linear or branched C1-C5 alkyl; and wherein $R_7$ is methyl, ethyl, propyl or isopropyl.

2. The composition of claim 1, wherein the at least one polymer is substantially free of a hydroxyl group.

3. The composition of claim 1, wherein the at least one polymer includes the elastomeric polymer and a filler polymer.

4. The composition of claim 1, wherein the at least one polymer includes the elastomeric polymer and a filler polymer.

5. The composition of claim 4, wherein the elastomeric polymer is included in an amount of about 5 wt% to about 80 wt % and the filler polymer is included in an amount of about 10 wt % to about 60wt % with reference to the total weight of the composition.

6. The composition of claim 1, further comprising a polymer that does not contain a silane group.

7. The composition of claim 1, wherein the silane-group-containing polymer is included in an amount of about 56 wt % to about 80 wt % with reference to the total weight of the composition.

8. The composition of claim 1, wherein the silane-group-containing polymer, when tested using an infrared spectrometer, shows no significant peaks in the range of 3200-3600 cm$^{-1}$.

9. The composition of claim 1, wherein the at least one polymerizable compound includes one of a (meth)acrylate-based monomer or a (meth)acrylate-based oligomer.

10. The composition of claim 9, wherein the (meth)acrylate-based monomer or (meth)acrylate-based oligomer includes a silane group.

11. The composition of claim 1, wherein the at least one polymerizable compound includes at least one of a cross-linking agent and a polymerization reaction enhancer.

12. The composition of claim 11, wherein the at least one polymerizable compound includes the cross-linking agent, and the cross-linking agent includes one of a silane-group-containing monomer or a silane-group-containing oligomer.

13. The composition of claim 11, wherein the cross-linking agent is included in an amount of about 10 wt % to about 80 wt % and the polymerization reaction enhancer is included in an amount of about 0.5 wt % to about 50 wt % with reference to the total weight of the composition.

14. The composition of claim 1, wherein the plurality of conductive particles includes metal balls and the metal balls are included in an amount of about 0.01 wt % to 30 wt % with reference to the total weight of the composition.

15. The composition of claim 1, further comprising a thermosetting initiator.

16. The composition of claim 15, wherein the thermo setting initiator includes one of a peroxide-based curing agent or an azo-based curing agent.

17. The composition of claim 1, wherein the composition is in a liquid phase.

18. The composition of claim1, wherein the at least one polymerizable compound is represented by Formula 7:

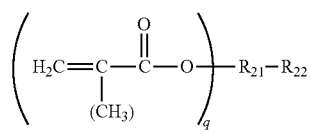

Formula 7 wherein q is 1,2or3;

wherein $R_{21}$ is phenyl, biphenyl, triphenyl, naphthalene, or halogen-substituted or unsubstituted linear or branched C1-C5 alkyl;

wherein $R_{22}$ is a substituent group represented by Formula 8-1, 8-2 or 8-3:

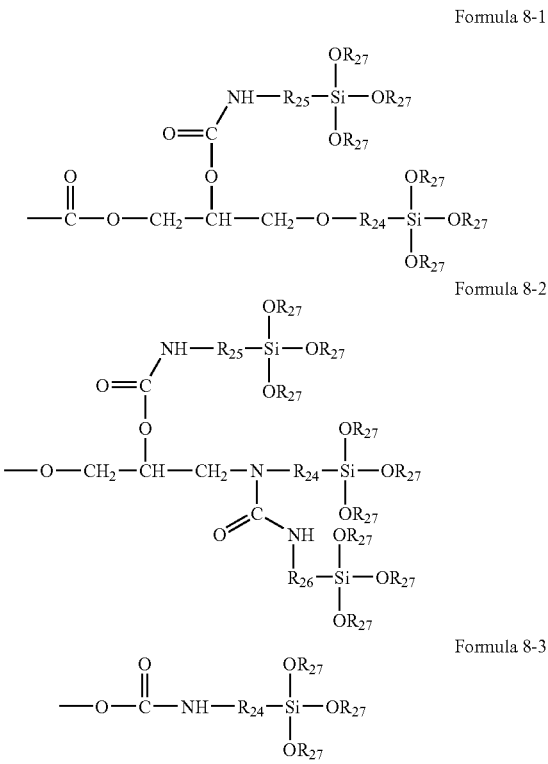

wherein each of $R_{24}$, $R_{25}$ and $R_{26}$ is phenyl, biphenyl, triphenyl, naphthalene or halogen-substituted or unsubstituted linear or branched C1-C5 alkyl; and wherein $R_{27}$ is methyl, ethyl, propyl or isopropyl.

19. The composition of claim 1, wherein the elastomeric polymer has a weight average molecular weight of about 500 to about 5,000,000.

20. The composition of claim 4, wherein the filler polymer is a silane-group-containing filler polymer having a weight average molecular weight of about 500 to about 300,000.

21. A method of making an electronic device, the method comprising:
providing an intermediate product of an electronic device comprising a first conductive portion;
providing the anisotropic conductive film forming composition of claim 1,
contacting the composition with the first conductive portion of the intermediate product; and
polymerizing the polymerizable compound of the anisotropic conductive film forming composition so as to form an anisotropic conductive film in contact with the first conductive portion.

22. The method of claim 21, wherein the intermediate product further comprises a second conductive portion, and wherein the method further comprises contacting the composition with the second conductive portion of the intermediate product prior to polymerizing.

23. The method of claim 21, wherein the anisotropic conductive film is substantially free of a hydroxyl group.

24. The method of claim 21, wherein the anisotropic conductive film shows no significant peaks in 3200-3600 cm$^{-1}$ when tested using an infrared spectrometer.

25. An electronic device made by the method of claim 21.

26. An electronic device comprising:
an anisotropic conductive film; and
at least one electrically conductive part in contact with the anisotropic conductive film,
wherein the anisotropic conductive film includes:
at least one polymer including a silane-group-containing polymer,
at least one polymerizable compound, and
a plurality of conductive particles,
wherein the silane-group-containing polymer includes an elastomeric polymer that is represented by Formula 2:

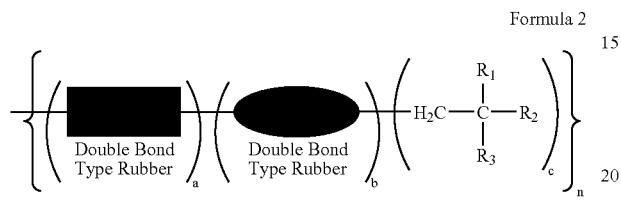

Formula 2 wherein the double bond type rubber in the formula 2 is selected from the group consisting of acrylonitrile-, butadiene-, styrene-, acryl-, isoprene-, urethane-, polyamide-, olefin-, and silicone-based rubbers;
wherein each of a, b and c is an integer from about 20 to about 100, and n is an integer from 1 to about 5;
wherein each of $R_1$, $R_2$ and R3 is a substituent group represented by Formula 3-1, 3-2 or 3-3 below:

Formula 3-1

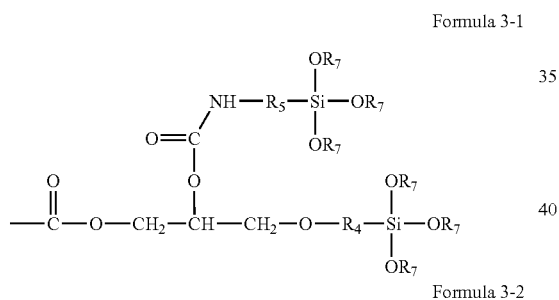

Formula 3-2

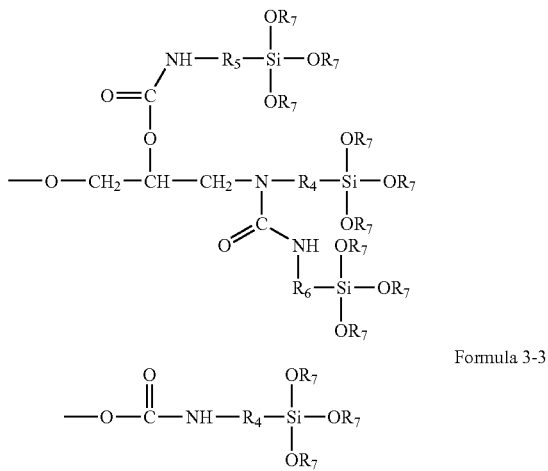

Formula 3-3 wherein each of $R_4$, $_5$ and $R_6$ is phenyl, biphenyl, triphenyl, or naphthalene, or halogen-substituted or unsubstituted, linear or branched C1-C5 alkyl and
wherein $R_7$ is methyl, ethyl, propyl or isopropyl.

27. The electronic device as claimed in claim 26, wherein the elastomeric polymer is included in an amount of about 5 wt % to about 80 wt % with reference to the total weight of the anisotropic conductive film.

28. An anisotropic conductive film forming composition, comprising:
at least one polymer including a silane-group-containing polymer;
at least one polymerizable compound; and
a plurality of conductive particles, wherein the silane-group-containing polymer is represented by Formula 4:

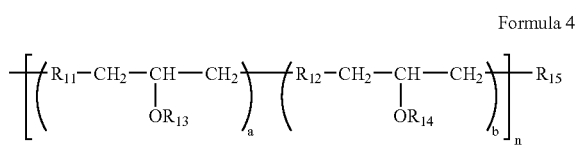

Formula 4 wherein each of $R_{11}$ and $R_{12}$ is a substituent group which is a dehydrogenated form of a substituted or unsubstituted phenol at one or two hydroxyl groups thereof;
wherein each of $R_{11}$ and $R_{12}$ is connected to a neighboring carbon atom via the oxygen atom of the dehydrogenated hydroxyl group;
wherein each of $R_{13}$ and $R_{14}$ is a substituent group represented by Formula 5:

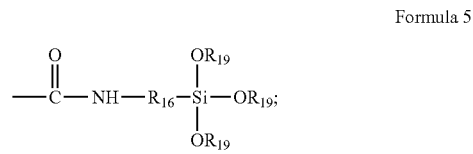

Formula 5 wherein $R_{15}$ is a substituent group represented by Formula 6:

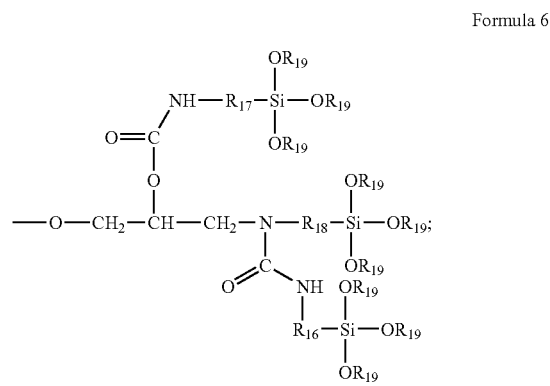

Formula 6 wherein each of a and b is an integer ranging from 1 to about 100, and n is 1, 2 or 3;
wherein each of $R_{16}$, $R_{17}$ and $R_{18}$ is phenyl, biphenyl, triphenyl, naphthalene, or halogen-substituted or unsubstituted linear or branched C1-C5 alkyl; and
wherein $R_{19}$ is methyl, ethyl, propyl or isopropyl.

29. The composition of claim 28, wherein the at least one polymerizable compound is represented by Formula 7:

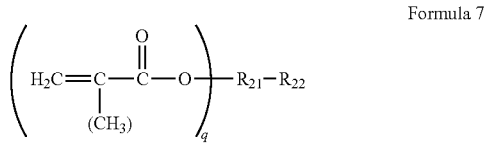

Formula 7 wherein q is 1,2 or 3;
wherein $R_{21}$ is phenyl, biphenyl, triphenyl, naphthalene, or halogen-substituted or unsubstituted linear or branched C1-C5 alkyl;
wherein $R_{22}$ is a substituent group represented by Formula 8-1, 8-2 or 8-3:

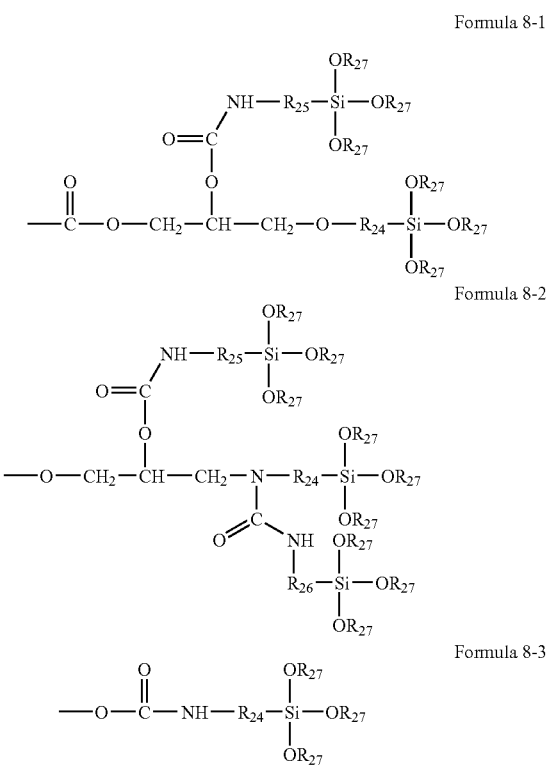

wherein each of $R_{24}$, $R_{25}$ and $R_{26}$ is phenyl, biphenyl, triphenyl, naphthalene or halogen-substituted or unsubstituted linear or branched C1-C5 alkyl; and
wherein $R_{27}$ is methyl, ethyl, propyl or isopropyl.

30. The composition of claim 28, wherein the substituted or unsubstituted phenol is selected from the group consisting of hydroquinone, 2-bromohydroquinone, resorcinol, catechol, bisphenol A, bisphenol F, bisphenol AD, bisphenol S. 4,4'-dihydroxybiphenyl, and bis(4-hydroxyphenyl)ether and the foregoing compounds substituted with one or more substituent groups.

31. The composition of claim 28, wherein the substituted phenol is substituted with one or more substituent groups selected from the group consisting of linear or branched C1-C5 alkyl, halogen-substituted linear or branched C1-C5 alkyl, nitro-substituted linear or branched C1-C5 alkyl, aryl, halogen-substituted aryl, nitro-substituted aryl, methylol, halogen-substituted methylol, nitro-substituted methylol, allyl, halogen-substituted allyl, nitro-substituted allyl, alicyclic, halogen-substituted alicyclic, nitro-substituted alicyclic, linear or branched C1-C5 alkoxycarbonyl, halogen-substituted linear or branched C1-C5 alkoxycarbonyl, and nitro-substituted linear or branched C1-C5 alkoxycarbonyl.

32. The composition of claim 28, wherein the phenol is selected from the group consisting of bisphenol A, bisphenol F, bisphenol AD, and bisphenol S substituent groups and wherein one or more non-benzene-ring carbon atoms of the bisphenols are substituted with a substituent group selected from the group consisting of linear or branched C1-C5 alkyl, allyl, alicyclic, or linear or branched C1-C5 alkoxycarbonyl.

33. An anisotropic conductive film forming composition, comprising:
at least one polymer including a silane-group-containing polymer;
at least one polymerizable compound; and
a plurality of conductive particles, wherein the at least one polymerizable compound is represented by Formula 7:

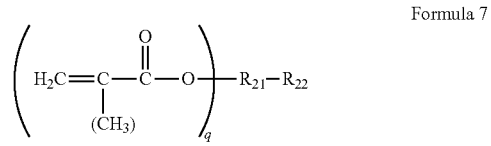

Formula 7 wherein q is 1,2or3;
wherein $R_{21}$ is phenyl, biphenyl, triphenyl, naphthalene, or halogen-substituted or unsubstituted linear or branched C1-C5 alkyl;
wherein $R_{22}$ is a substituent group represented by Formula 8-1, 8-2 or 8-3:

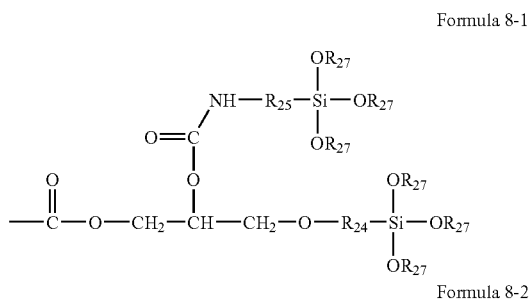

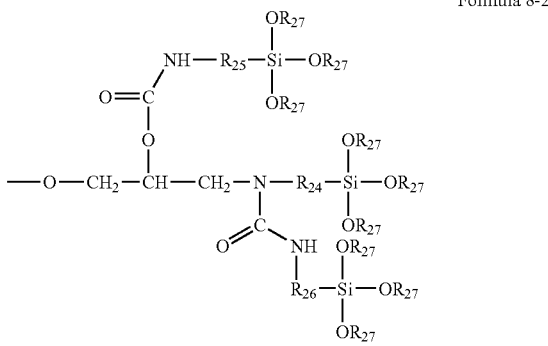

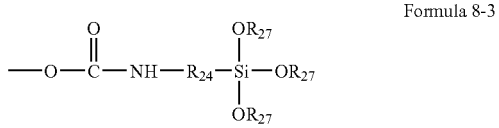

wherein each of $R_{24}$, $R_{25}$ and $R_{26}$ is phenyl, biphenyl, triphenyl, naphthalene or halogen-substituted or unsubstituted linear or branched C1-C5 alkyl; and wherein $R_{27}$ is methyl, ethyl, propyl or isopropyl.

* * * * *